United States Patent
Yoshida

(10) Patent No.: US 8,145,177 B2
(45) Date of Patent: Mar. 27, 2012

(54) RECEIVING APPARATUS

(75) Inventor: Toshikazu Yoshida, Kanagawa (JP)

(73) Assignee: Sony Corporation, Tokyo (JP)

( * ) Notice: Subject to any disclaimer, the term of this patent is extended or adjusted under 35 U.S.C. 154(b) by 289 days.

(21) Appl. No.: 12/564,962

(22) Filed: Sep. 23, 2009

(65) Prior Publication Data
US 2010/0075621 A1   Mar. 25, 2010

(30) Foreign Application Priority Data

Sep. 24, 2008 (JP) ................. P2008-244384

(51) Int. Cl.
*H04B 1/26* (2006.01)
(52) U.S. Cl. ........... 455/323; 455/190.1; 455/207; 455/326; 455/264
(58) Field of Classification Search ........ 455/323, 455/130, 190.1, 207, 208, 209, 260, 265, 455/293, 311, 315, 326, 255, 264
See application file for complete search history.

(56) References Cited

U.S. PATENT DOCUMENTS

| | | | | |
|---|---|---|---|---|
| 6,553,216 B1 * | 4/2003 | Pugel et al. | ............ | 455/340 |
| 2004/0171360 A1 * | 9/2004 | Oosawa et al. | ............ | 455/136 |
| 2006/0014509 A1 * | 1/2006 | Xu et al. | ............ | 455/255 |
| 2008/0076489 A1 * | 3/2008 | Rosener et al. | ............ | 455/575.2 |

FOREIGN PATENT DOCUMENTS

| | | |
|---|---|---|
| JP | 2005-295471 | 10/2005 |
| JP | 2008-53836 | 3/2008 |

* cited by examiner

*Primary Examiner* — Tuan Pham
(74) *Attorney, Agent, or Firm* — Frommer Lawrence & Haug LLP; William S. Frommer; Ellen Marcie Emas

(57) ABSTRACT

A receiving apparatus includes: a frequency conversion portion that has at least a mixer that down-converts a frequency of a reception radio-frequency signal by mixing the radio-frequency signal and an output from a voltage-controlled oscillator and outputs the down-converted radio-frequency signal; and a resistor element that has a resistance value to set a DC bias voltage of an input transistor in the mixer to which the radio-frequency signal is inputted to a center value of a dynamic range.

5 Claims, 6 Drawing Sheets

RECEIVING APPARATUS

BACKGROUND OF THE INVENTION

1. Field of the Invention

The present invention relates to a receiving apparatus that improves reception characteristic deterioration of a radio-frequency signal caused by an interfering wave.

2. Description of Related Art

For a distortion characteristic of a receiver, there are a method of changing automatic gain control (AGC) of a low noise amplifier (LNA) most appropriately (see, for example, JP-A-2005-295471) and a method of improving the characteristic of an MOPLL (Mixer Oscillator Phase Locked Loop).

An MOPLL IC is formed, for example, of a mixer, a voltage-controlled oscillator, and an amplifier, and it down-converts a signal (see, for example, JP-2008-53836). To be more concrete, the mixer extracts an intermediate frequency signal (IF signal) from a radio-frequency signal (RF signal) and a locally-generated signal from the voltage-controlled oscillator, that is, it down-converts an RF signal to an IF signal at a lower frequency.

In general, a mixer is a crucial circuit that has influences on an operation of the overall receiving apparatus. The performance of the mixer is evaluated, for example, by a 3rd-order intermodulation (IM3). The 3rd-order intermodulation referred herein means an interfering signal that overlaps a nearby frequency of or the same frequency as a desired wave when two waves are aligned equally with respect to the desired wave, and it is used as a parameter of distortion. Hence, a resistor element corresponding to a bias resistor is normally provided inside the MOPLL IC. Owing to this configuration, the distortion characteristic is improved.

SUMMARY OF THE INVENTION

In the frequency band of a radio-frequency signal, however, there is a case where the set value (constant) of the internal reference bias resistor of the MOPLL IC does not take an adequate value. When the internal bias resistor of the MOPLL IC deviates from the reference value as above, a signal undergoes deformation, which may consequently cause the receiver sensitivity to deteriorate.

In general, when the MOPLL IC is incorporated into the receiving apparatus, it is assumed that this IC is normally used in a pattern where this IC and a filter circuit (band-pass filter) that extracts a signal in a predetermined frequency band from a radio-frequency signal are connected via a coupling capacitor. Accordingly, in a case where an internal bias voltage of the MOPLL IC is to be manipulated, it is necessary to replace the IC itself and it has been difficult to improve the distortion characteristic.

Thus, it is desirable to provide a receiving apparatus capable of improving the distortion characteristic readily in a severe radio wave environment.

According to an embodiment of the present invention, there is provided a receiving apparatus including a frequency conversion portion that has at least a mixer that down-converts a frequency of a reception radio-frequency signal by mixing the radio-frequency signal and an output from a voltage-controlled oscillator and outputs the down-converted radio-frequency signal, and a resistor element that has a resistance value to set a DC bias voltage of an input transistor in the mixer to which the radio-frequency signal is inputted to a center value of a dynamic range.

According to the embodiment of the present invention, it is possible to secure a more satisfactory reception performance by improving the distortion characteristic even in a severe radio wave environment in the presence of multiple waves.

DESCRIPTION OF THE PREFERRED EMBODIMENTS

Hereinafter, embodiments of the present invention will be described. Firstly, an example employing a configuration having a single input will be described as a first embodiment, and an example employing a configuration provided with resistor elements having different resistance values for respective frequency bands will be described next as a second embodiment.

First Embodiment

Figure 1:
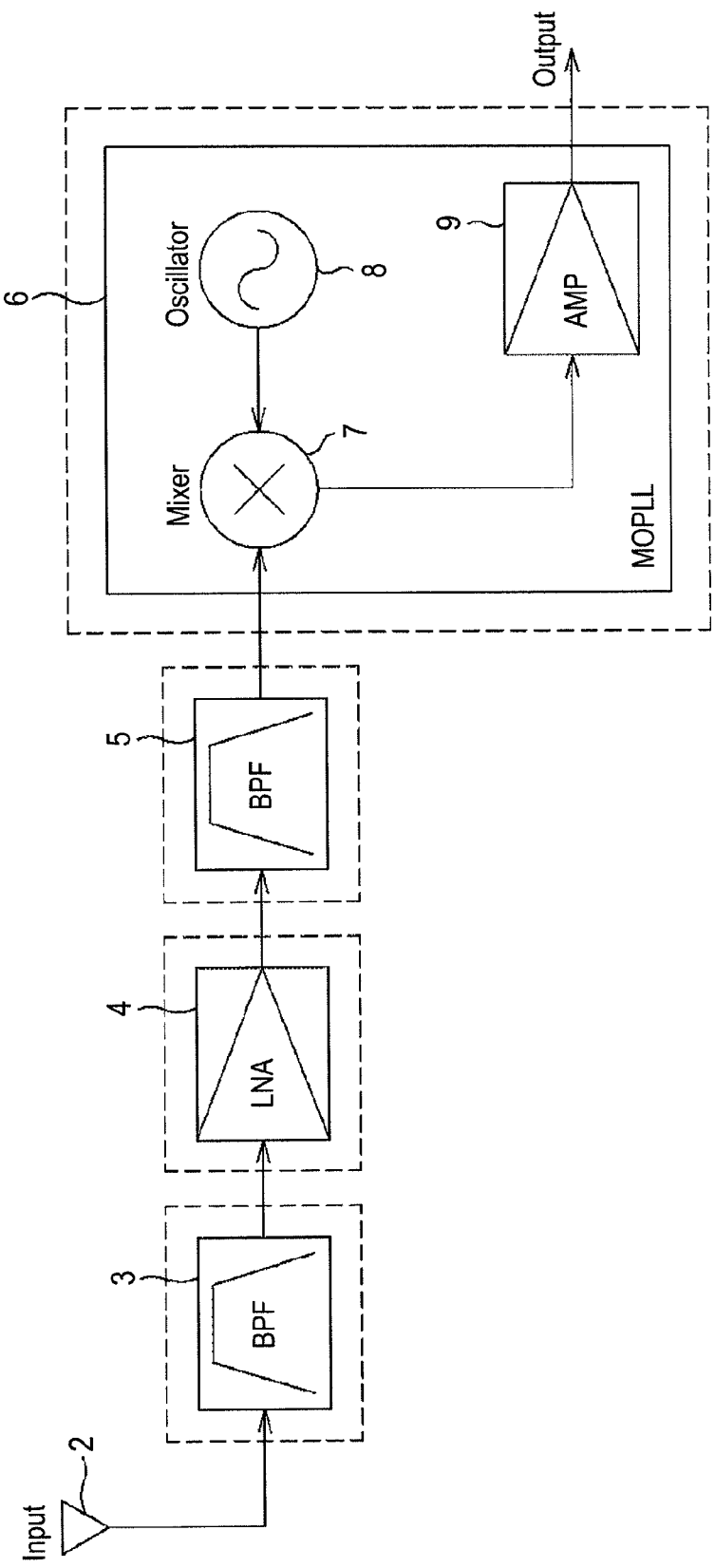
FIG. 1 is a block diagram showing an example of the configuration of a TV tuner as an example of a receiving apparatus according to an embodiment of the present invention.

FIG. 1 is a block diagram showing an example of the configuration of a TV tuner, which is an example of a receiving apparatus according to an embodiment of the present invention. As is shown in FIG. 1, a receiving apparatus 1 includes an antenna 2, a band-pass filter (BPF) 3 in the former stage, a low noise amplifier (LNA) 4 that amplifies a signal, a band-pass filter (BPF) 5 in the latter stage, and an MOPLL IC 6. The MOPLL IC 6 has a mixer 7, a voltage-controlled oscillator 8, and an amplifier 9, and as will be described below, it has capabilities of a mixer, a PLL (Phase Locked Loop) circuit, and an amplifier.

An example of a reception operation of a radio-frequency signal in the receiving apparatus 1 will now be described. Initially, a radio-frequency signal is inputted into a tuner input terminal (not shown) from the antenna 2. A signal in a reception band (for example, VHF (Very High Frequency) TV broadcasting, UHF (Ultra High Frequency) TV broadcasting, and satellite broadcasting (BS (Broadcasting Satellite) and CS (Communications Satellite), etc.) is selected by the band-pass filter 3 and all the other frequency components are removed.

The signal in the reception band selected by the band-pass filter 3 is amplified by the low noise amplifier 4. An output signal from the low noise amplifier 4 is inputted into the band-pass filter 5 and a signal in the reception band is selected by the band-pass filter 5. The signal selected by the band-pass filter 5 is inputted into the MOPLL IC 6.

In the MOPLL IC 6, the signal inputted from the band-pass filter 5 is down-converted to an intermediate frequency by the mixer 7. For example, an unillustrated PLL circuit generates a control voltage corresponding to the reception channel on the basis of a reference signal outputted from an unillustrated reference signal oscillator and a locally-generated signal outputted from the voltage-controlled oscillator 8. The voltage-controlled oscillator 8 generates a locally-generated signal, which is a locally-oscillating frequency (a sum of the reception frequency and an intermediate frequency signal), according to the control voltage from the PLL circuit. The mixer 7 generates an intermediate frequency signal by mixing an output signal from the band-pass filter 5 and a locally-generated signal from the voltage-controlled oscillator 8. The amplifier 9 amplifies the intermediate frequency signal outputted from the mixer 7 and supplies the amplified intermediate frequency signal to an SAW (Surface Acoustic Wave) filter (not shown) provided in the subsequent stage of the MOPLL IC 6. By using the MOPLL IC 6 having the configuration as above, it becomes possible to reduce the receiving apparatus 1 in size.

In a case where the level of an interfering wave is not lowered to a micro-level by the band-pass filter 3 and the band-pass filter 5 shown in FIG. 1, the interfering wave is inputted into the block of the MOPLL IC 6, that is, into the mixer 7. An example of the interfering wave can be a 3rd-order intermodulation. In general, a mixer is a circuit that has influences on an operation of the overall receiving apparatus and the performance thereof is evaluated by the dynamic range, a noise figure (NF), a 3rd-order intermodulation, and so forth.

The MOPLL IC 6 is normally provided with an internal resistor element corresponding to a bias resistor and the distortion characteristic is improved by this configuration. However, in a case where the terrestrial digital broadcasting is received, that is, under the reception condition in the presence of a strong interfering wave, deterioration of the reception sensitivity caused by distortion of the interfering wave signal raises a problem. In particular, interference caused by a broadband signal like in the digital broadcasting, interference caused by inter-modulation distortion of the interfering wave signal raises a problem. For example, when a tower for the terrestrial digital broadcasting is erected, a distortion readily occurs in a signal because the signal level becomes stronger. It is therefore desirable to provide a receiving apparatus having a higher distortion characteristic.

To this end, the receiving apparatus 1 is provided with a resistor element that sets the bias voltage of an input transistor in the mixer 7 to the center value of the dynamic range in order to improve the distortion characteristic of the internal transistor of the MOPLL IC 6.

Figure 2:
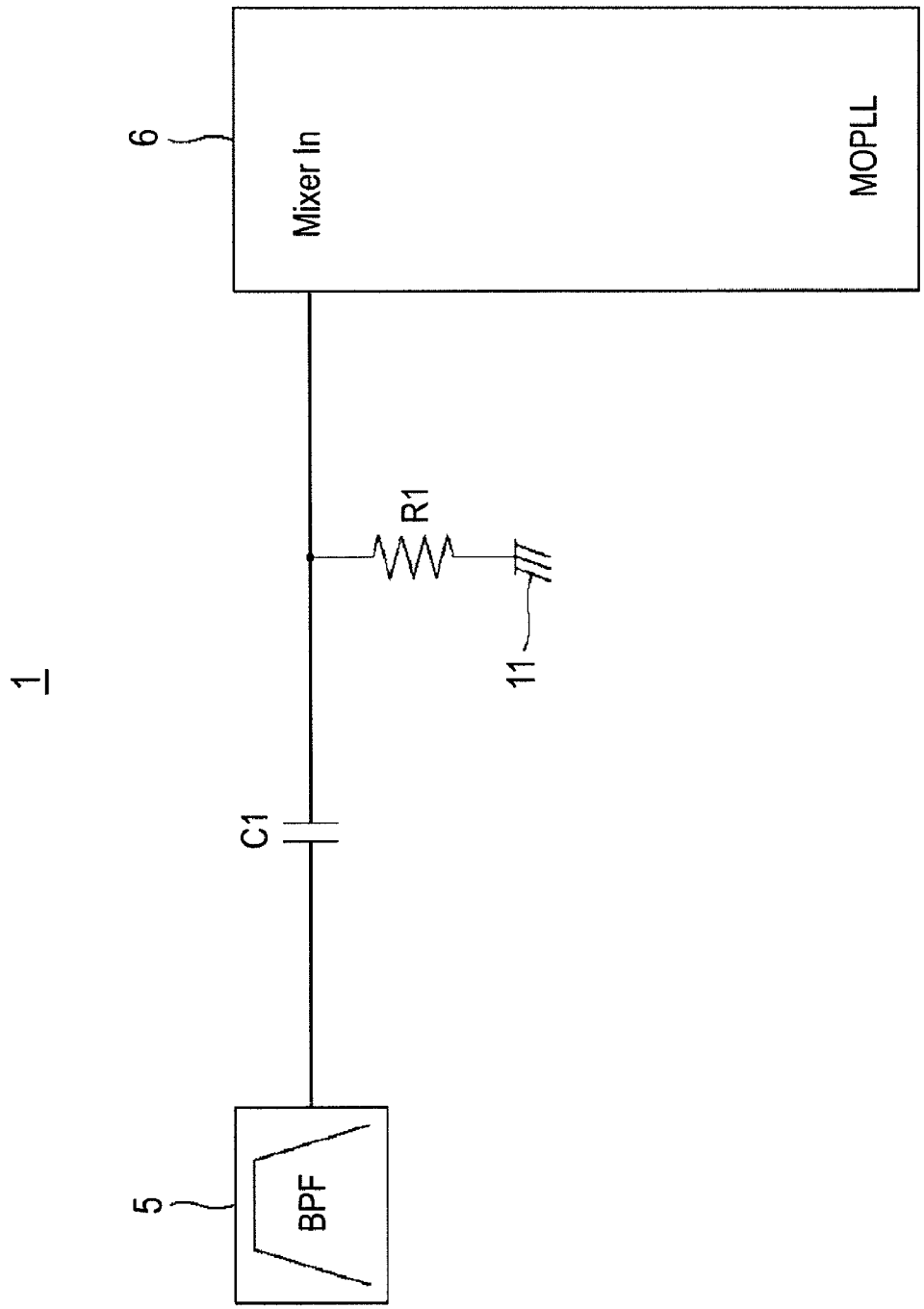
FIG. 2 is a view showing a circuit disposed between a band-pass filter and an MOPLL IC.

FIG. 2 is a view showing a circuit disposed between the band-pass filter 5 and the MOPLL IC 6. In order to improve the distortion characteristic as described above, in the receiving apparatus 1 shown in FIG. 1, a resistor element R1 is disposed between a signal line and a ground (GND) 11 adjacently to an RF input pin of the MOPLL IC 6, that is, adjacently to an input transistor in the mixer 7. In other words, in the receiving apparatus 1, the resistor element R1 is disposed at the position specified above in order to fine tune a resistor element corresponding to the bias resistor provided inside the MOPLL IC 6.

For example, when the bias voltage of the internal input transistor of the MOPLL IC 6 deviates from the center value, an output signal undergoes deformation. Hence, in order to prevent distortion of the output signal, that is, in order to maximize the amplitude of the output signal with respect to the input signal, the resistor element R1 has a resistance value that sets an output voltage of the internal input transistor of the MOPLL IC 6 to half the power supply voltage.

In addition, it is preferable to set the resistance value of the resistor element R1 to a value that does not attenuate for a signal from the band-pass filter 5 and that does not have influences on the internal bias resistor of the MOPLL IC 6. For example, it is preferable to set the resistance value of the resistor element R1 to be at least ten times as large the internal bias resistance value of the MOPLL IC 6. In the receiving apparatus 1, the resistor element R1 as described above is disposed between the signal line connecting the band-pass filter 5 and the mixer 7 and the ground 11 adjacently to the input transistor in the mixer 7 to which a signal from the band-pass filter 5 is inputted. Herein, C1 denotes a coupling capacitor of the band-pass filter 5 and the MOPLL IC 6.

As has been described, in the receiving apparatus 1, the resistor element R1 having the resistance value to set the DC bias voltage of the input transistor in the mixer 7 to the center value of the dynamic range is disposed adjacently to the RF input pin of the MOPLL IC 6. The receiving apparatus 1 thus becomes able to move and set the DC bias point of the RF input transistor of the MOPLL IC 6 to the center value (center) of the dynamic range. Hence, by using the resistor element R1 as above, the receiving apparatus 1 becomes able to improve the distortion characteristic of the internal transistor of the MOPLL IC 6. In other words, according to the receiving apparatus 1, even in a case where an inexpensive MOPLL IC is used and the reference value of the internal reference DC bias voltage of the IC has deviated, it is possible to improve the distortion characteristic without having to replace the MOPLL IC.

It should be appreciated that the receiving apparatus 1 can adopt a configuration other than the example of the configuration shown in FIG. 2 as long as the conditions specified above are satisfied. For example, in the receiving apparatus 1, the resistor element R1 may be provided between the signal line and a power supply line. Alternatively, in the receiving apparatus 1, the resistor element R1 may be replaced by the power supply. Even in a case where the receiving apparatus 1 has a configuration other than the circuit configuration shown in FIG. 2, it is possible to achieve the function and the advantage same as those of the circuit configuration shown in FIG. 2.

Figure 3:
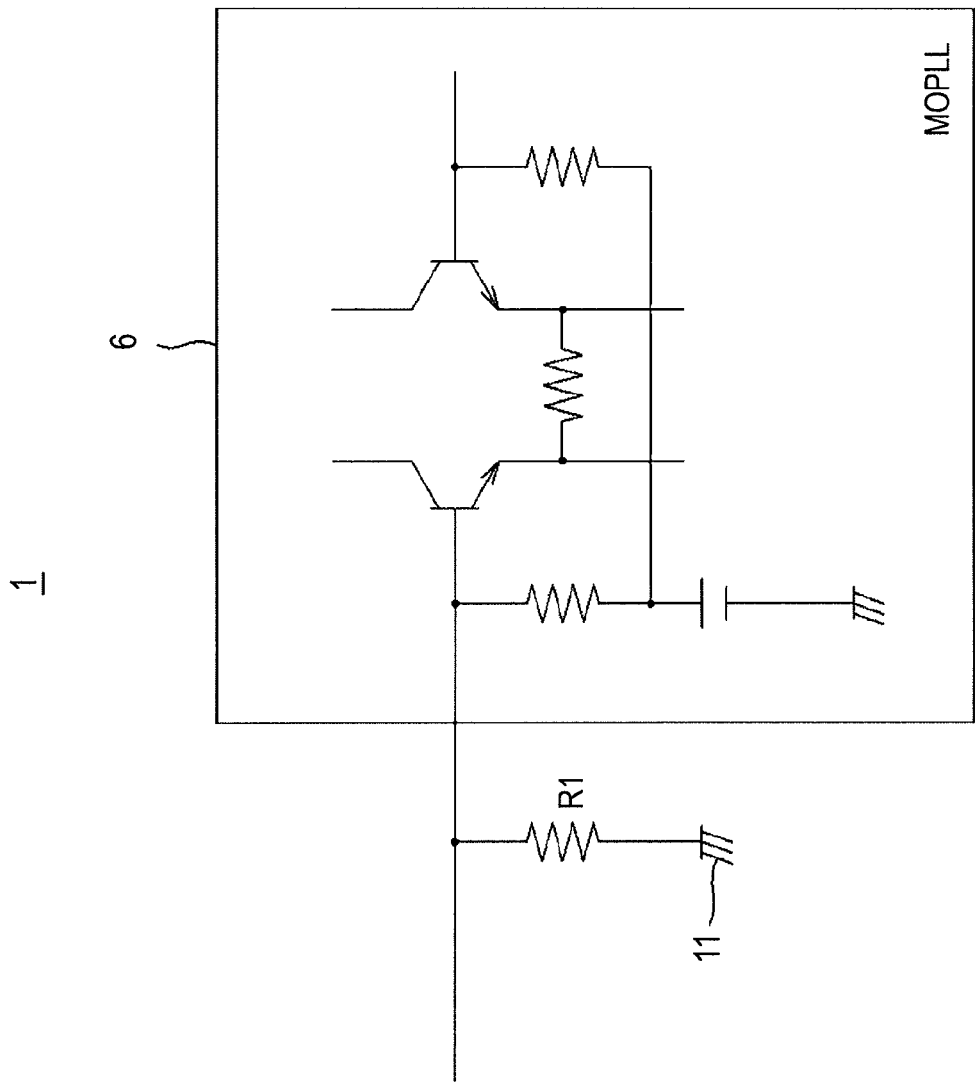
FIG. 3 is a view showing the circuit disposed between the band-pass filter and the MOPLL IC.

FIG. 3 is a view showing the circuit disposed between the band-pass filter 5 and the MOPLL IC 6. As is shown in FIG. 3, by providing the resistor element R1 adjacently to the RF input pin of the MOPLL IC 6, that is, adjacently to the input transistor in the mixer 7, it becomes possible to change the base bias value. It is preferable to use the resistor element R1 having a resistance value with which a differential balance in the MOPLL IC 6 is not disrupted exceedingly.

In general, the noise figure deteriorates when the distortion character is improved, whereas the distortion characteristic deteriorates when the noise figure is improved. Such being the case, the receiving apparatus 1 sets the resistance value of the resistor element R1 concretely as follows.

Figure 4:
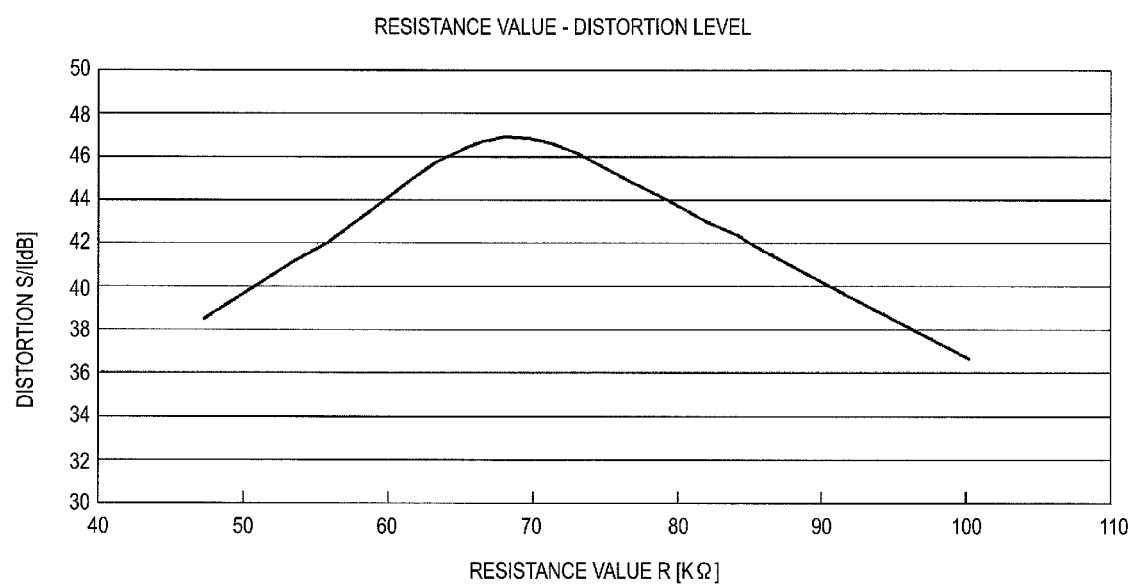
FIG. 4 is a graph showing the relation of a resistance value and the distortion characteristic at a predetermined frequency.

FIG. 4 is a graph showing a relation of the resistance value and the distortion characteristic at a predetermined frequency. The abscissa is used for the resistance value [Ω] of the resistor element and the ordinate is used for S/I [dB] representing the distortion characteristic. Herein, S/I stands for a signal to interference ratio. As has been described, by setting the resistance value of the resistor element R1 to an optimal value, that is, a resistance value with which the signal to interference ratio takes the maximum value, the receiving apparatus 1 becomes able to improve the distortion characteristic by preventing the occurrence of distortion in the signal. Herein, because the resistor element R1 is inserted into the signal line, it is preferable to select a value that does not attenuate for the signal and that does not have significant influences on the internal bias resistor of the MOPLL.

Second Embodiment

Figure 5:
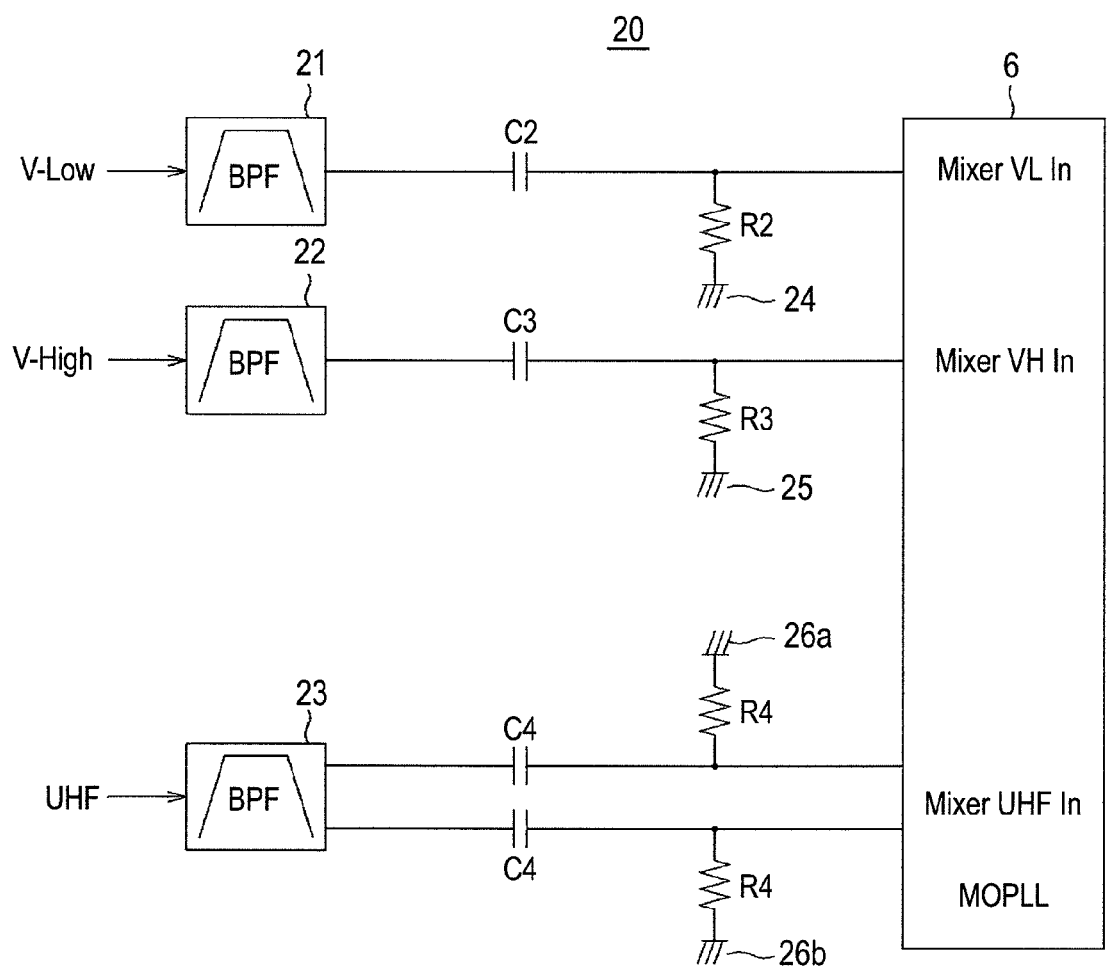
FIG. 5 is a view showing an example of the configuration of a receiving apparatus according to an embodiment of the present invention.

Hereinafter, a receiving apparatus according to another embodiment of the present invention will be described as a second embodiment. FIG. 5 is a view showing an example of the configuration of a receiving apparatus 20 according to the embodiment of the present invention. To be more concrete, FIG. 5 shows the configuration up to the point where each band of the terrestrial TV broadcasting is inputted into the mixer 7 in the MOPLL IC 6 (up to MIXER IN).

The receiving apparatus 20 includes a band-pass filter, a capacitor, and a resistor element for each band in the terrestrial TV broadcasting, such as the VHF band and the UHF band. As is shown in FIG. 5, the receiving apparatus 20 includes a band-pass filter 21 that extracts a signal in a frequency band (low VHF), for example, of 90 to 108 MHz, a band-pass filter 22 that extracts a signal in a frequency band (high VHF (high Very High Frequency) of an ultrashort wave (for example, 170 to 222 MHz) higher than the low VHF, and a band-pass filter 23 that extracts a signal of the terrestrial analog TV broadcasting, the terrestrial digital TV broadcasting, and so forth in the UHF band.

A resistor element R2 shown in FIG. 5 is disposed between a signal connecting the band-pass filter 21 and the mixer 7 in the MOPLL IC 6 and a ground 24 adjacently to an input transistor in the mixer 7 to which a signal from the band-pass filter 21 is inputted. Herein, C2 denotes a coupling capacitor of the band-pass filter 21 and the MOPLL IC 6. A resistor element R3 is disposed between a signal line connecting the band-pass filter 22 and the mixer 7 and a ground 25 adjacently to an input transistor in the mixer 7 to which a signal from the band-pass filter 22 is inputted. Herein, C3 denotes a coupling capacitor of the band-pass filter 22 and the MOPLL IC 6.

In the receiving apparatus 1 according to the first embodiment described above, the RF signal input circuit from the band-pass filter 5 to the MOPLL IC 6 has a single input. By contrast, the receiving apparatus 20 shown in FIG. 5 has a differential input. To be more concrete, resistor elements R4 are disposed between signal lines connecting the band-pass filter 23 and the mixer 7 in the MOPLL IC 6 and respective ground 26a and ground 26b adjacently to an input transistor in the mixer 7 to which a signal from the band-pass filter 23 is inputted. Herein, C4 denotes each coupling capacitor of the band-pass filter 23 and the MOPLL IC 6.

In other words, in a case where a signal in the UHF band is differentially inputted to the mixer 7 in the MOPLL IC 6 from the band-pass filter 23 via a plurality of signal lines, the receiving apparatus 20 includes the capacitor C4 and the resistor element R4 for each of these two signal lines. As has been described, by forming the circuit as described above with a plurality of signal lines for the differential input, the receiving apparatus 20 becomes able to achieve the same advantage as that of the receiving apparatus 1 described above, that is, improvement of the distortion characteristic.

Figure 6:
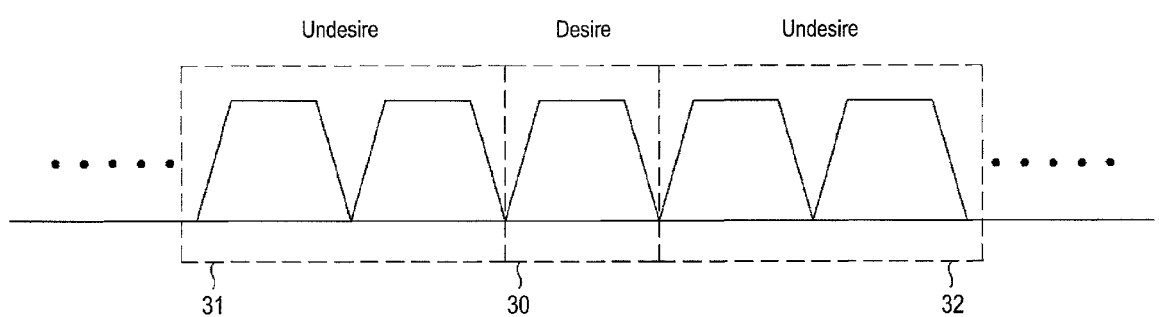
FIG. 6 is a view showing an example of the radio wave environment of a radio-frequency signal to be received.

FIG. 6 is a view showing an example of the radio wave environment of a radio-frequency signal to be received. In FIG. 6, the abscissa is used for the frequency of a signal. For example, as is shown in FIG. 6, even in a radio wave environment in which a reception band (Desire) 30 and adjacent bands (Undesire) 31 and 32 of an interfering wave are present mixedly, the receiving apparatus according to the embodiment of the present invention is able to improve the distortion characteristic. More specifically, even in the radio wave environment where more bands are present mixedly, the receiving apparatus according to the embodiment of the present invention is able to secure a satisfactory reception performance by improving the distortion characteristic in the severe wave environment in the presence of multiple waves as is shown in FIG. 6.

Even in a case where an existing inexpensive IC having a poor distortion characteristic is used, the receiving apparatus according to the embodiment of the present invention is able to improve the distortion characteristic. The cost therefore can be reduced. Further, the receiving apparatus according to the embodiment of the present invention is able to improve the distortion characteristic with a simple and inexpensive circuit configuration.

It should be appreciated that the receiving apparatus according to the embodiment of the present invention is not limited to the embodiments described above and various modifications are possible. For example, the embodiments above described a case where the MOPLL IC is used as an example of a frequency conversion portion. However, a circuit excluding an amplifier, for example, a PLL IC can be used as well.

The present application contains subject matter related to that disclosed in Japanese Priority Patent Application JP 2008-244384 filed in the Japan Patent Office on Sep. 24, 2008, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A receiving apparatus comprising:
   a frequency conversion portion that has at least a mixer that down-converts a frequency of a reception radio-frequency signal by mixing the radio-frequency signal and an output from a voltage-controlled oscillator and outputs the down-converted radio-frequency signal; and
   a resistor element that has a resistance value to set a DC bias voltage of an input transistor in the mixer to which the radio-frequency signal is inputted to a center value of a dynamic range,
   wherein the resistor element is disposed between a signal line and a ground adjacently to an input transistor in the mixer and has a resistance value with which a signal to interference ratio indicating a distortion characteristic in the predetermined frequency band takes a maximum value.

2. The receiving apparatus according to claim 1 further comprising:
   a first filter circuit that extracts a signal in a predetermined frequency band from the reception radio-frequency signal;
   an amplifier that amplifies the signal extracted by the first filter circuit; and
   a second filter circuit that extracts a signal in the predetermined frequency band from the signal amplified by the amplifier,
   wherein the mixer down-converts a frequency of the signal extracted by the second filter circuit by mixing the signal and the output from the voltage-controlled oscillator, and
   the resistor element is disposed between the signal line connecting the second filter circuit and the mixer and the ground and sets the DC bias voltage of the input transistor in the mixer to which the signal from the second filter circuit is inputted to the center value of the dynamic range.

3. The receiving apparatus according to claim 1,
wherein the frequency conversion portion is formed of an MOPLL (Mixer Oscillator Phase Locked Loop) circuit having the mixer, the voltage-controlled oscillator, and an amplifier that amplifies an output signal from the mixer and outputs the amplified signal.

4. The receiving apparatus according to claim 1,
wherein the resistor element is provided for each predetermined band of the radio-frequency signal, so that each resistor element sets the DC bias voltage of the input transistor in the mixer to the center value of the dynamic range in the corresponding band.

5. The receiving apparatus according to claim 2,
wherein the resistor element is provided to each of a plurality of signal lines in a case where the signal extracted by the first filter circuit is differentially inputted into the frequency conversion portion via the plurality of signal lines.

\* \* \* \* \*